(12) United States Patent (10) Patent No.: US 8,278,744 B2
Onishi (45) Date of Patent: Oct. 2, 2012

(54) SEMICONDUCTOR DEVICE AND METHOD FOR MANUFACTURING SAME

(75) Inventor: Kazuaki Onishi, Hyogo-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 468 days.

(21) Appl. No.: 12/536,331

(22) Filed: Aug. 5, 2009

(65) Prior Publication Data

US 2010/0084760 A1 Apr. 8, 2010

(30) Foreign Application Priority Data

Oct. 7, 2008 (JP) ................................. 2008-260848

(51) Int. Cl.
*H01L 23/02* (2006.01)
(52) U.S. Cl. ........ 257/686; 257/691; 257/698; 257/724; 257/E25.001
(58) Field of Classification Search .................. 257/678, 257/685–686, 691, 692, 698, 723, 724, E25.001; 438/107, 109, 106, 121
See application file for complete search history.

(56) References Cited

U.S. PATENT DOCUMENTS 6,362,964 B1 * 3/2002 Dubhashi et al. ............. 361/707
2003/0197198 A1 * 10/2003 Panella et al. ................. 257/200

FOREIGN PATENT DOCUMENTS

| JP | 2000-068446 | 3/2000 |
| JP | 2007-115987 | 5/2007 |
| JP | 2007-242703 | 9/2007 |

\* cited by examiner

*Primary Examiner* — Benjamin Sandvik
*Assistant Examiner* — Scott R Wilson
(74) *Attorney, Agent, or Firm* — Patterson & Sheridan, LLP (57) ABSTRACT

A semiconductor device includes: a semiconductor chip mounting substrate, a control circuit board, a power terminal holder and a semi-fixing member. The semiconductor chip mounting substrate includes a substrate, a semiconductor chip provided on a first major surface of the substrate, and a first and second semiconductor chip connection electrodes. The control circuit board is provided generally in parallel to the first major surface and includes a control circuit, a control signal terminal connected to the control circuit, and a through hole extending in a direction generally perpendicular to the first major surface. The power terminal holder is provided on opposite side of the control circuit board from the semiconductor chip mounting substrate and includes a power terminal. The semi-fixing member includes a shank portion and an end portion. The shank portion is fixed to the power terminal holder and penetrates through the through hole. A cross section of the shank portion in a plane orthogonal to the extending direction of the through hole is smaller than a size of the through hole. The end portion is connected to a tip of the shank portion. A cross section of the end portion in the plane is larger than the size of the through hole. The first semiconductor chip connection electrode is connected to a first terminal of the semiconductor chip and the control signal terminal. The second semiconductor chip connection electrode is connected to a second terminal of the semiconductor chip and the power terminal.

13 Claims, 4 Drawing Sheets

SEMICONDUCTOR DEVICE AND METHOD FOR MANUFACTURING SAME

CROSS-REFERENCE TO RELATED APPLICATIONS

This application is based upon and claims the benefit of priority from the prior Japanese Patent Application No. 2008-260848, filed on Oct. 7, 2008; the entire contents of which are incorporated herein by reference.

BACKGROUND OF THE INVENTION

1. Field of the Invention

This invention relates to a semiconductor device including a control circuit board, and a method for manufacturing the same.

2. Background Art

A semiconductor device including a semiconductor chip and a control circuit board for controlling it is known. For instance, a high-power semiconductor chip, such as an IGBT (Insulated Gate Bipolar Transistor) and power MOSFET, is mounted on a semiconductor chip mounting substrate, whereas control signal terminals of a control circuit board including a control circuit for controlling the semiconductor chip are connected to electrodes on the semiconductor chip mounting substrate by solder or the like, so that the control circuit is electrically connected to the semiconductor chip. Here, the accuracy of alignment between the control signal terminal and the electrode on the semiconductor chip mounting substrate, that is, the horizontal positional accuracy of the terminal, is important.

To improve this positional accuracy, a technique of using positioning pins is proposed (see, e.g., JP-A-2007-242703 (Kokai)).

In another known structure, a power terminal holder including power terminals electrically connected to a semiconductor chip is provided above a control circuit board. In such a structure, the accuracy of the height of the control signal terminal and the power terminal is important. More specifically, if there is a difference in height, as viewed from the semiconductor chip mounting substrate, between the lower surface of the power terminal of the power terminal holder and the lower surface of the control signal terminal of the control circuit board, then good connection cannot be achieved in connecting these terminals to the semiconductor chip. In a semiconductor device under such condition, because of the insufficient connection, cracks and the like occur in the connecting portion due to local expansion and contraction of the connecting portion caused by heat generation and the like during operation. This results in an interference with the normal operation of the semiconductor device.

SUMMARY OF THE INVENTION

According to an aspect of the invention, there is provided a semiconductor device comprising: a semiconductor chip mounting substrate including a substrate, a semiconductor chip provided on a first major surface of the substrate, and a first and second semiconductor chip connection electrodes; a control circuit board provided generally in parallel to the first major surface and including a control circuit configured to control the semiconductor chip, a control signal terminal connected to the control circuit, and a through hole extending in a direction generally perpendicular to the first major surface; a power terminal holder provided on opposite side of the control circuit board from the semiconductor chip mounting substrate and including a power terminal serving for at least one of input and output of power of the semiconductor chip; and a semi-fixing member including a shank portion and an end portion, the shank portion being fixed to the power terminal holder and penetrating through the through hole, a cross section of the shank portion in a plane orthogonal to the extending direction of the through hole being smaller than a size of the through hole, the end portion being connected to a tip of the shank portion, a cross section of the end portion in a plane orthogonal to the extending direction of the through hole being larger than the size of the through hole, the first semiconductor chip connection electrode being connected to a first terminal of the semiconductor chip and the control signal terminal, and the second semiconductor chip connection electrode being connected to a second terminal different from the first terminal of the semiconductor chip and the power terminal.

According to another aspect of the invention, there is provided a method for manufacturing a semiconductor device, the device including: a semiconductor chip mounting substrate including a substrate, a semiconductor chip provided on a first major surface of the substrate, and a first and second semiconductor chip connection electrodes; a control circuit board provided generally in parallel to the first major surface and including a control circuit configured to control the semiconductor chip, a control signal terminal connected to the control circuit, and a through hole extending in a direction generally perpendicular to the first major surface; a power terminal holder provided on opposite side of the control circuit board from the semiconductor chip mounting substrate and including a power terminal serving for at least one of input and output of power of the semiconductor chip; and a semi-fixing member including a shank portion fixed to the power terminal holder and penetrating through the through hole, a cross section of the shank portion and an end portion, the shank portion being in a plane orthogonal to the extending direction of the through hole being smaller than a size of the through hole, and the end portion being connected to a tip of the shank portion, a cross section of the end portion in a plane orthogonal to the extending direction of the through hole being larger than the size of the through hole, the first semiconductor chip connection electrode being connected to a first terminal of the semiconductor chip and the control signal terminal, and the second semiconductor chip connection electrode being connected to a second terminal different from the first terminal of the semiconductor chip and the power terminal, the method comprising: penetrating the shank portion of the semi-fixing member through the through hole provided in the control circuit board and fixing the semi-fixing member to the power terminal holder, the through hole extending in a direction generally perpendicular to a second major surface of the control circuit board, the shank portion having a cross section smaller than the cross section of the through hole in a plane parallel to the second major surface, the control circuit board and the power terminal being relatively moved in a direction parallel to the extending direction of the through hole; and connecting the control signal terminal to the first semiconductor chip connection electrode and connecting the power terminal to the second semiconductor chip connection electrode.

DETAILED DESCRIPTION OF THE INVENTION

Embodiments of the invention will now be described with reference to the drawings.

The drawings are schematic or conceptual. The relationship between the thickness and the width of each portion, and the size ratio between the portions, for instance, are not necessarily identical to those in reality. Furthermore, the same portion may be shown with different dimensions or ratios depending on the figures.

In the present specification and the drawings, the same elements as those described previously with reference to earlier figures are labeled with like reference numerals, and the detailed description thereof is omitted as appropriate.

First Embodiment

Figure 1:
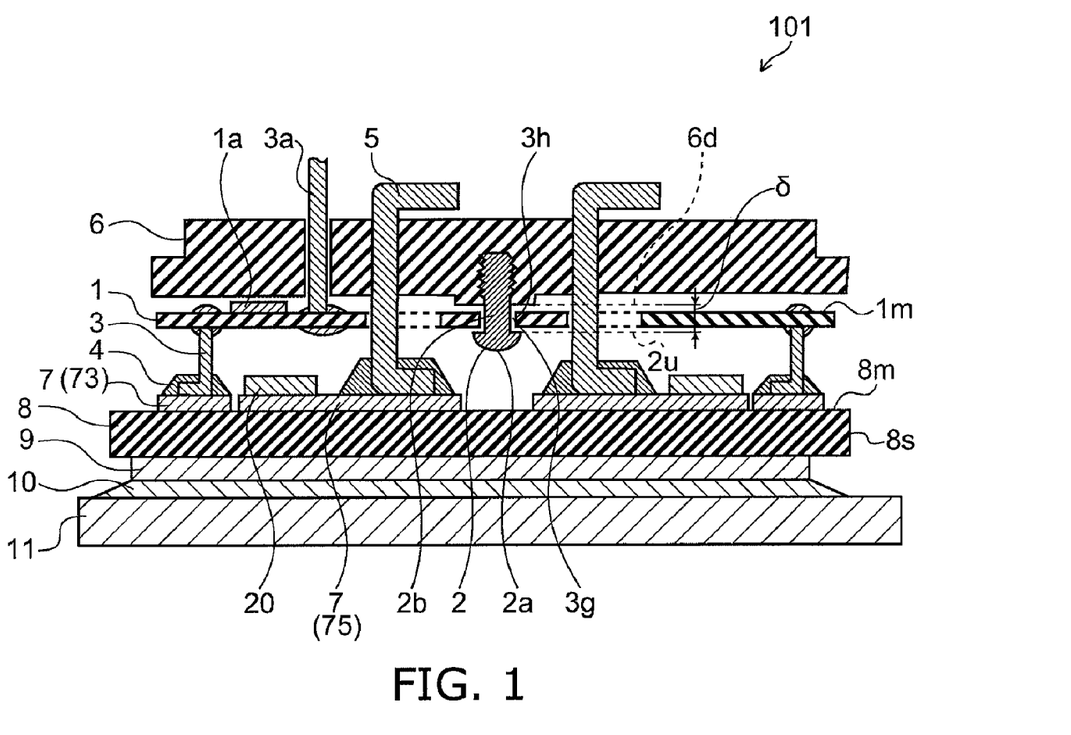
FIG. 1 is a schematic cross-sectional view illustrating the configuration of a semiconductor device according to a first embodiment of the invention.

FIG. 1 is a schematic cross-sectional view illustrating the configuration of a semiconductor device according to a first embodiment of the invention.

As shown in FIG. 1, the semiconductor device 101 according to the first embodiment of the invention includes a semiconductor chip mounting substrate 8, a control circuit board 1, a power terminal holder 6, and a semi-fixing member 2.

The semiconductor chip mounting substrate 8 includes a substrate 8s, a semiconductor chip 20 provided on a first major surface 8m of the substrate 8s, and a semiconductor chip connection electrode 7 provided on the first major surface 8m and connected to the semiconductor chip 20.

The semiconductor chip 20 can illustratively be a high-power semiconductor element, such as an IGBT (Insulated Gate Bipolar Transistor) and power MOSFET (Metal Oxide Semiconductor Field Effect Transistor). However, the invention is not limited thereto. The semiconductor chip 20 may be a semiconductor element of any configuration and any specification. The semiconductor chip 20 is provided on the semiconductor chip connection electrode 7. Here, the semiconductor chip 20 and the semiconductor chip connection electrode 7 are connected to each other illustratively by bonding wires, not shown. Furthermore, the backside electrode of the semiconductor chip 20 and the semiconductor chip connection electrode 7 are connected to each other by a conductive material such as solder.

The semiconductor chip connection electrode 7 is provided with a first semiconductor chip connection electrode (a control signal terminal connection electrode 73) and a second semiconductor connection electrode (a power terminal connection electrode 75). The first semiconductor chip connection electrode is connected to the semiconductor chip 20 and a control signal terminal 3 described later. The second semiconductor chip connection electrode is connected to the semiconductor chip 20 and a power terminal 5 described later. In the following, for simplicity of description, the control signal terminal connection electrode 73 and the power terminal connection electrode 75 are collectively referred to as a semiconductor chip connection electrode 7 as appropriate.

The semiconductor chip mounting substrate 8 is illustratively a ceramic substrate. In this example, a circuit pattern 9 is provided on the opposite side of the semiconductor chip mounting substrate 8 from the first major surface 8m, and a heat dissipation plate 11 is provided therebelow. A reflow solder 10 is provided between the circuit pattern 9 and the heat dissipation plate 11. Heat generated in the semiconductor chip 20 is transferred to the heat dissipation plate 11 side through the semiconductor chip mounting substrate 8, the circuit pattern 9, and the reflow solder 10 so as to achieve efficient heat dissipation.

The semiconductor chip 20 may be provided on the semiconductor chip mounting substrate 8 singly or in a plurality, and the number of semiconductor chips 20 is arbitrary. Furthermore, the material used for the semiconductor chip mounting substrate 8 is not limited to ceramics, but any material can be used.

The control circuit board 1 is provided generally in parallel to the first major surface 8m of the semiconductor chip mounting substrate 8. The control circuit board 1 includes a control circuit 1a for controlling the aforementioned semiconductor chip 20, a control signal terminal 3 connected to the control circuit 1a and the semiconductor chip connection electrode 7 (control signal terminal connection electrode 73), and a through hole 3h. The control circuit 1a can illustratively include various electronic components, such as capacitors, resistors, rectifying elements, and transistors. In this figure, the control circuit 1a is depicted schematically, and individual electronic components are not shown. The through hole 3h penetrates through the control circuit board 1 in a direction generally perpendicular to a second major surface 1m of the control circuit board 1. That is, the through hole 3h extends in a direction generally perpendicular to the first major surface 8m of the semiconductor chip mounting substrate 8.

Besides the control circuit 1a, the control signal terminal 3, and the through hole 3h described above, the control circuit board 1 can be illustratively equipped with any semiconductor chip other than the semiconductor chip 20 mounted on the semiconductor chip mounting substrate 8.

The power terminal holder 6 is provided on the opposite side of the control circuit board 1 from the semiconductor chip mounting substrate 8. That is, the power terminal holder 6 is provided above the control circuit board 1. The power terminal holder 6 includes a power terminal 5 for at least one of input and output of power of the semiconductor chip 20, and the power terminal 5 is connected to the semiconductor chip connection electrode 7 (power terminal connection electrode 75). The power terminal holder 6 can illustratively be made of resin.

For instance, the power terminal 5 is extracted to the upper surface of the power terminal holder 6, and used to perform at least one of input and output for power of the semiconductor chip 20. Furthermore, a control electrode 3a of the control circuit board 1 is extracted through the power terminal holder 6 to the upper surface of the power terminal holder 6, and a control signal to the control circuit 1a is illustratively applied to the control electrode 3a.

These semiconductor chip mounting substrate 8, control circuit board 1, and power terminal holder 6 can be housed in a casing, not shown. After being housed in the casing, the control electrode 3a can be bent.

The semi-fixing member 2 penetrates through the through hole 3h of the control circuit board 1 and is fixed to the power terminal holder 6. The semi-fixing member 2 can illustratively be a screw. That is, the semi-fixing member 2, such as a screw, is passed through the through hole 3h, and the thread provided illustratively at the other end of the semi-fixing member 2 opposite to the end portion 2a is screwed and fixed into the power terminal holder 6.

The semi-fixing member 2 includes an end portion 2a and a shank portion 2b. The end portion 2a is connected to the tip of the shank portion 2b. This tip is the end of the shank portion 2b on the semiconductor chip mounting substrate 8 side. The end portion 2a is illustratively the head portion of a screw, and provided nearer to the semiconductor chip mounting substrate 8 than the surface of the control circuit board 1 on the semiconductor chip mounting substrate 8 side. The end portion 2a is larger than the size of the through hole 3h in the plane orthogonal to the extending direction of the through hole 3h. That is, the size of the cross section of the end portion 2a, which is the head portion of a screw, in a direction perpendicular to the extending direction of the through hole 3h is larger than the size of the through hole 3h. Thus, the semi-fixing member 2 includes an end portion provided at the end of the shank portion 2b on the semiconductor chip mounting substrate 8 side and being wider than the through hole 3h. That is, the end portion 2a cannot penetrate through the through hole 3h even if it is forced.

On the other hand, the cross section of the shank portion 2b in a direction perpendicular to the extending direction of the through hole 3h is smaller than the size of the through hole 3h. That is, the thickness of the shank portion 2b is smaller than the size (e.g., the diameter of the hole) of the through hole 3h, and a gap 3g is provided between the shank portion 2b and the through hole 3h.

Thus, the control circuit board 1 has a structure which is movable at least in the direction parallel to the extending direction of the through hole 3h in a gap having a distance δ between the upper surface 2u (the surface on the opposite side from the semiconductor chip mounting substrate 8 side) of the end portion 2a of the semi-fixing member 2 and the lower surface 6d (the surface on the semiconductor chip mounting substrate 8 side) of the power terminal holder 6. That is, the relative position between the semi-fixing member 2 and the control circuit board 1 is movable, and the movable direction includes the direction parallel to the extending direction of the through hole 3h. Here, the movable direction may include a direction perpendicular to the extending direction of the through hole 3h.

However, the control signal terminal 3 fixed to the control circuit board 1 is fixed to the control signal terminal connection electrode 73 illustratively by a solder 4, and the power terminal 5 fixed to the power terminal holder 6 is fixed to the power terminal connection electrode 75 illustratively by a solder 4. Thus, the control circuit board 1 and the power terminal holder 6 are fixed to each other. Consequently, the semi-fixing member 2 fixed to the power terminal holder 6 is relatively fixed to the control circuit board 1.

However, a gap 3g is provided between the shank portion 2b and the through hole 3h. Thus, the control circuit board 1 can move at least in the direction parallel to the extending direction of the through hole 3h in the gap having a distance δ between the upper surface 2u of the end portion 2a of the semi-fixing member 2 and the lower surface 6d of the power terminal holder 6. Hence, even if there is a difference in height between the control signal terminal 3 and the power terminal 5, the control circuit board 1 and the power terminal holder 6 are coupled together by compensating for the difference. Thus, these terminals can be favorably connected to the semiconductor chip mounting substrate.

In the following, an example method for manufacturing the semiconductor device 101 according to this embodiment is described.

Figure 2A:
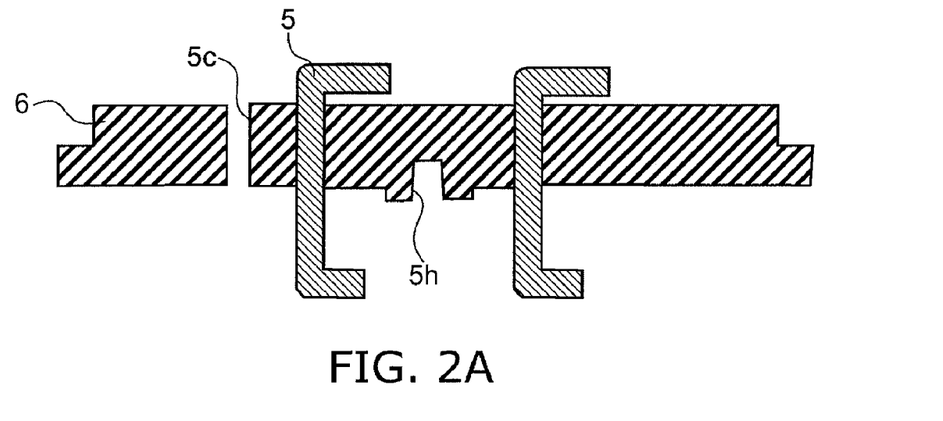
FIGS. 2A-2C are sequential schematic cross-sectional views illustrating a method for manufacturing the semiconductor device according to the first embodiment of the invention.
Figure 2B:
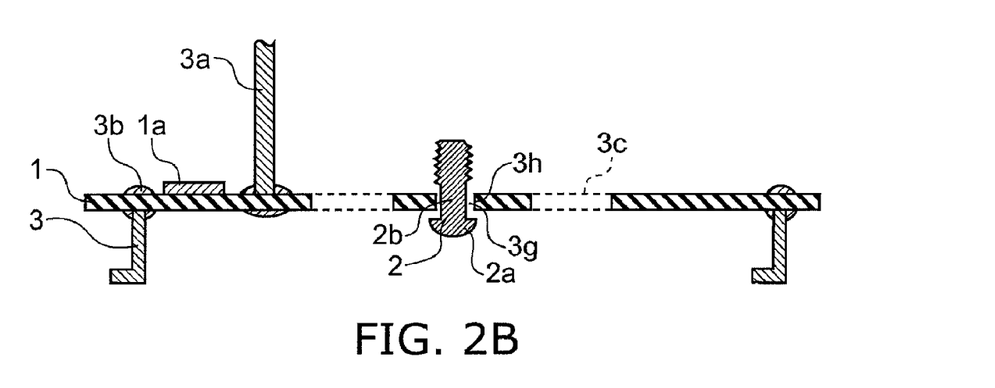
Figure 2C:
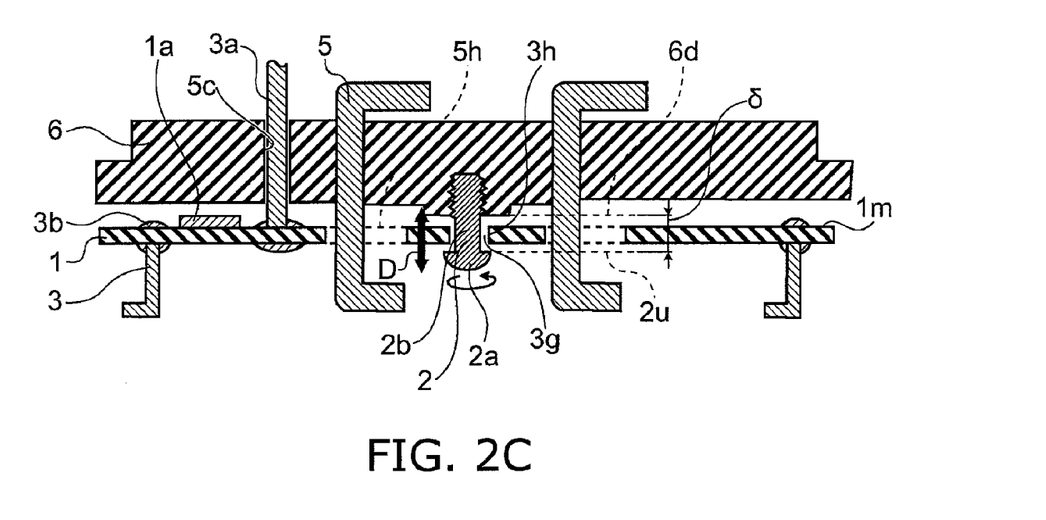

FIG. 2 is a sequential schematic cross-sectional view illustrating a method for manufacturing the semiconductor device according to the first embodiment of the invention.

Figure 3A:
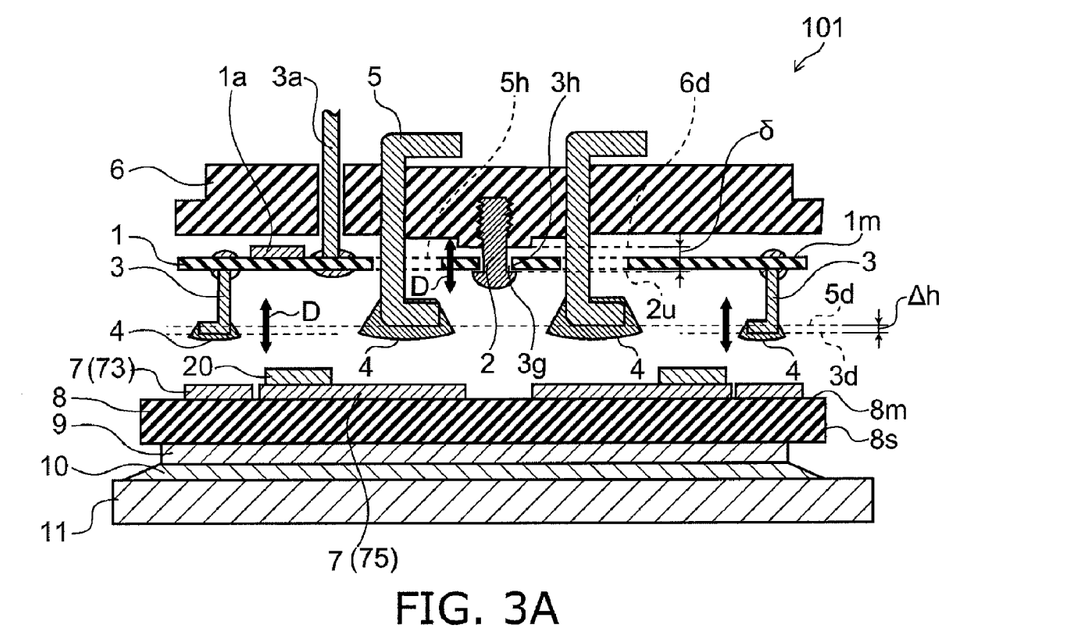
FIGS. 3A and 3B are sequential schematic cross-sectional views subsequent to FIG. 2.
Figure 3B:
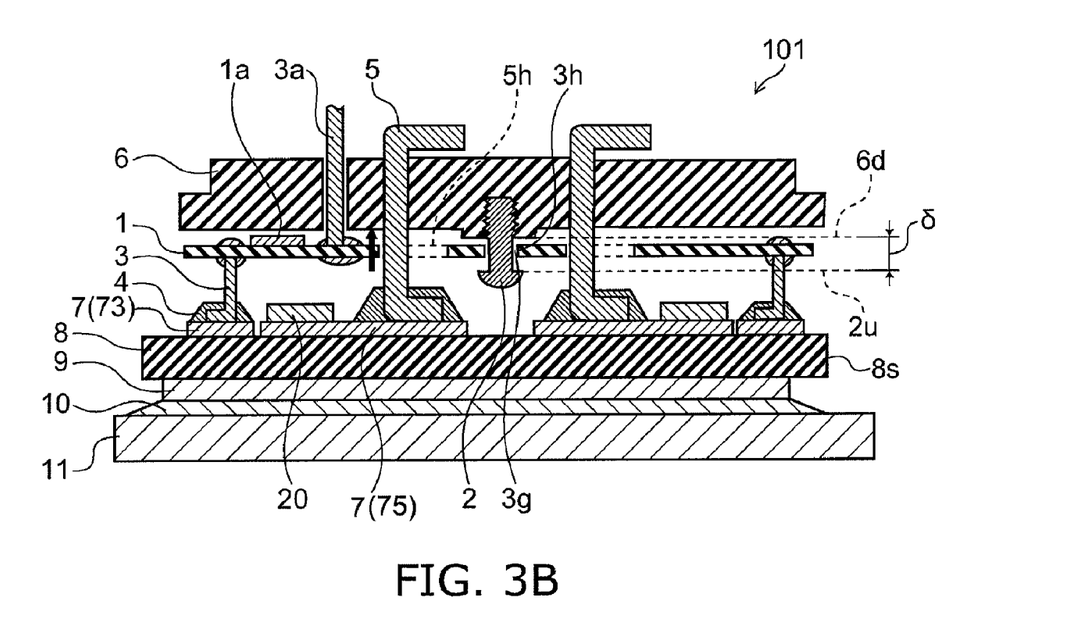

FIG. 3 is a sequential schematic cross-sectional view subsequent to FIG. 2.

As shown in FIG. 2A, first, for instance, a power terminal 5 is attached to a power terminal holder 6. Here, the power terminal holder 6 includes a control electrode hole 5c through which a control electrode 3a is to be passed later, and a semi-fixing member hole 5h to which a semi-fixing member 2 is to be attached later. A gap is provided between the control electrode hole 5c and the control electrode 3a, and allows the power terminal holder 6 and the control electrode 3a to be relatively moved when the control electrode 3a is penetrated through the control electrode hole 5c.

Then, as shown in FIG. 2B, a control circuit 1a, a control signal terminal 3, and a control electrode 3a are provided on a control circuit board 1. The control signal terminal 3 and the control electrode 3a are fixed to the control circuit board 1 illustratively by a solder 3b. Here, the control circuit board 1 is previously provided with a power terminal hole 3c so that the power terminal 5 can be passed therethrough. A gap is provided between the power terminal hole 3c and the power terminal 5, and allows the control circuit board 1 and the power terminal 5 to be relatively moved when the power terminal 5 is penetrated through the power terminal hole 3c. Then, a semi-fixing member 2 is penetrated through a through hole 3h of the control circuit board 1. That is, the shank portion 2b of the semi-fixing member 2 is passed through the through hole 3h. Here, because the size of the end portion 2a of the semi-fixing member 2 is larger than the through hole 3h, the end portion 2a does not penetrate through the through hole 3h. On the other hand, in the through hole 3h, a gap 3g is provided between the semi-fixing member 2 and the control circuit board 1, so that the semi-fixing member 2 can be moved in the through hole 3h along the extending direction of the through hole 3h.

In the actual work, the semi-fixing member 2 is passed through the through hole 3h of the control circuit board 1 in a position turned upside down in FIG. 2B. Then, by gravity, the semi-fixing member 2 can be easily maintained in the state of being fitted in the through hole 3h, and the end portion 2a (screw head) of the semi-fixing member 2 does not drop down through the through hole 3h.

The process illustrated in FIG. 2A and the process illustrated in FIG. 2B can be interchanged with each other. Furthermore, if the structures illustrated in FIGS. 2A and 2B are prepared in advance, these processes can be omitted.

Then, as shown in FIG. 2C, the power terminal 5 is passed through the power terminal hole 3c of the control circuit board 1, and the control electrode 3a is passed through the control electrode hole 5c of the power terminal holder 6, so that the control circuit board 1 and the power terminal holder 6 are combined. With the shank portion 2b of the semi-fixing member 2 penetrated through the through hole 3h, the semi-fixing member 2 is fixed to the power terminal holder 6. For instance, the screw, or the semi-fixing member 2, is rotated so that the semi-fixing member 2 is tightened in the semi-fixing member hole 5h. This work can also be done in a position turned upside down in FIG. 2C. Then, the end portion 2a (screw head) of the semi-fixing member 2 does not drop down through the through hole 3h, which facilitates the work.

The work illustrated in FIG. 2B and the work illustrated in FIG. 2C can be done simultaneously. Furthermore, as illustrated in FIG. 2C, after the control circuit board 1 and the power terminal holder 6 are combined, the shank portion 2b of the semi-fixing member 2 is passed through the through hole 3h, and in this state, the screw, or the semi-fixing member 2, can be rotated to be tightened in the semi-fixing member hole 5h. That is, the process illustrated in FIG. 2B can be omitted.

Here, as illustrated by arrow D in FIG. 2C, along the shank portion 2b, the semi-fixing member 2 and the control circuit board 1 can be moved relative to each other. Thus, the control circuit board 1 and the power terminal holder 6 can be moved relatively in the direction (the direction parallel to the extending direction of the through hole 3h) perpendicular to the second major surface 1m of the control circuit board 1. Here, this movable distance is illustratively a distance obtained by subtracting the thickness of the control circuit board 1 from the distance δ between the upper surface 2u of the end portion 2a of the semi-fixing member 2 and the lower surface 6d of the power terminal holder 6. A desirable distance δ can be obtained by suitably designing the length of the semi-fixing member 2, such as a screw, and the depth of the screw attached into the power terminal holder 6.

Furthermore, in accordance with the gap 3g between the through hole 3h and the shank portion 2b, the control circuit board 1 and the power terminal holder 6 can be moved also in a direction (a direction perpendicular to the extending direction of the through hole 3h) parallel to the second major surface 1m. If the control circuit board 1 and the power terminal holder 6 are displaced to a large extent in a direction parallel to the second major surface 1m, the control signal terminal 3 and the power terminal 5 are relatively displaced to a large extent in the direction parallel to the second major surface 1m, which is not desirable. Hence, the gap 3g is set to a suitable value so that the relative displacement between the control signal terminal 3 and the power terminal 5 is restricted to within a practically allowable range.

Furthermore, in accordance with the width of the gap 3g, the control circuit board 1 and the power terminal holder 6 can be tilted with respect to each other. The displacement in the direction parallel to the second major surface 1m and the tilt angle as described above are suitably designed on the basis of workability in this work and the work described later and the allowable value of relative misalignment among the control signal terminal 3, the power terminal 5, and the semiconductor chip connection electrode 7, and the gap 3g is suitably set on the basis thereof.

Thus, the semi-fixing member 2 allows the control circuit board 1 to be moved relative to the power terminal holder 6 in the direction perpendicular to the second major surface 1m within the range of the distance obtained by subtracting the thickness of the control circuit board 1 from the distance δ, and to be fixed in the direction parallel to the second major surface 1m with a relatively small range of misalignment as compared with the distance obtained by subtracting the thickness of the control circuit board 1 from the distance δ. That is, the relative moving distance between the control circuit board 1 and the power terminal holder 6 in the direction orthogonal to the extending direction of the through hole 3h can be made smaller than the relative moving distance between the control circuit board 1 and the power terminal holder 6 in the direction parallel to the extending direction of the through hole 3h.

Then, as shown in FIG. 3A, the control circuit board 1 combined with the power terminal holder 6 is opposed to the first major surface 8m of the semiconductor chip mounting substrate 8. In this example, the control circuit board 1 is opposed to the semiconductor chip mounting substrate 8 so that the opposite side of the control circuit board 1 from the second major surface 1m is opposed to the first major surface 8m of the semiconductor chip mounting substrate 8. At this time, the control circuit board 1 is fixed to the power terminal holder 6 by the semi-fixing member 2, and the semi-fixing member 2 itself is fixed to the power terminal holder 6. Hence, the control circuit board 1 and the semi-fixing member 2 do not drop down from the power terminal holder 6 by gravity.

Then, the control signal terminal 3 and the power terminal 5 are each opposed to the semiconductor chip connection electrode 7. The portion of the control signal terminal 3 and the power terminal 5 opposed to the semiconductor chip connection electrode 7 is provided with a solder 4.

At this time, a height mismatch Δh occurs between the lower surface 3d of the control signal terminal 3 opposed to the semiconductor chip connection electrode 7 and the lower surface 5d of the power terminal 5 opposed to the semiconductor chip connection electrode 7. This Δh is caused by the height variation of the lower surface 3d of the control signal terminal 3 ascribed to the length of the control signal terminal 3 and the attached state of the control signal terminal 3 to the control circuit board 1, in combination with the height variation of the lower surface 5d of the power terminal 5 ascribed to the length of the power terminal 5 and the attached state of the power terminal 5 to the power terminal holder 6. Thus, the height mismatch Δh is difficult to completely eliminate.

For instance, in the example illustrated in FIG. 3A, the lower surface 3d of the control signal terminal 3 is displaced downward relative to the lower surface 5d of the power terminal 5, resulting in a height mismatch Δh corresponding to this displacement.

Here, in the semiconductor device 101 according to this embodiment, the control circuit board 1 and the power terminal holder 6 can relatively move in the range of the distance obtained by subtracting the thickness of the control circuit board 1 from the distance δ. Hence, by compensating for the height mismatch Δh, the height of the lower surface 3d of the control signal terminal 3 can be substantially matched with the height of the lower surface 5d of the power terminal 5.

More specifically, as shown in FIG. 3B, the control signal terminal 3 and the power terminal 5 are brought into contact with the semiconductor chip connection electrode 7, and the control circuit board 1 combined with the power terminal holder 6 is combined with the semiconductor chip mounting substrate 8. Thus, by compensating for the height mismatch Δh, the position of the control circuit board 1 relative to the power terminal holder 6 can be adjusted so that the height of the lower surface 3d of the control signal terminal 3 is matched with the height of the lower surface 5d of the power terminal 5.

For instance, in this example, as illustrated in FIG. 3B, the control circuit board 1 is relatively moved toward the power terminal holder 6 so that the lower surface 3d of the control signal terminal 3 has substantially the same height as the lower surface 5d of the power terminal 5. Then, in this state, the control signal terminal 3 and the power terminal 5 are connected and fixed to the semiconductor chip connection electrode 7 illustratively by a solder 4.

Thus, this embodiment can provide a semiconductor device in which these terminals can be favorably connected to the semiconductor chip mounting substrate 8 even if there is a difference in height between the control signal terminal 3 and the power terminal 5.

Here, the height mismatch Δh can be eliminated if the distance obtained by subtracting the thickness of the control circuit board 1 from the distance δ between the upper surface 2u (the surface on the power terminal holder 6 side) of the end portion 2a of the semi-fixing member 2 and the lower surface 6d (the surface on the control circuit board 1 side) of the power terminal holder 6 is set to be larger than the height mismatch Δh (the distance between the plane including the lower surface 3d and the plane including the lower surface 5d) between the lower surface 3d of the control signal terminal 3 opposed to the semiconductor chip connection electrode 7 and the lower surface 5d of the power terminal 5 opposed to the semiconductor chip connection electrode 7.

COMPARATIVE EXAMPLE

Figure 4:
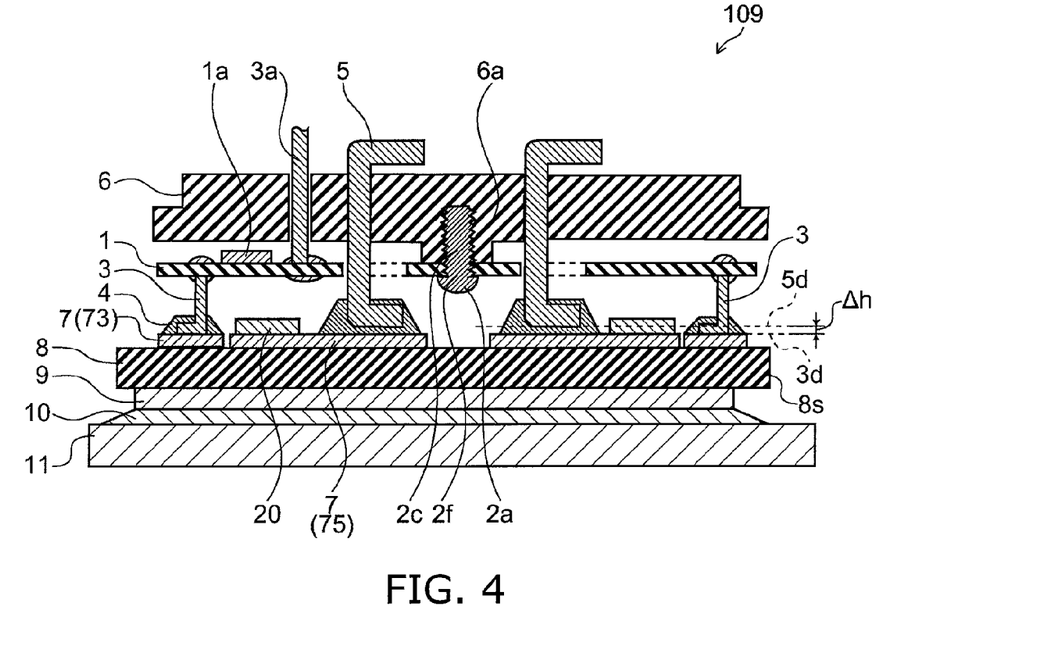
FIG. 4 is a schematic cross-sectional view illustrating the configuration of a semiconductor device of a comparative example.

FIG. 4 is a schematic cross-sectional view illustrating the configuration of a semiconductor device of a comparative example.

As shown in FIG. 4, in the semiconductor device 109 of the comparative example, in the screw 2f corresponding to the semi-fixing member 2 of the semiconductor device 101 of this embodiment, the cross section of the shank portion 2c in a direction perpendicular to the extending direction of the through hole 3h is substantially the same as the size of the through hole 3h. That is, no gap is provided between the shank portion 2c and the through hole 3h. Furthermore, in the semiconductor device 109 of the comparative example, the thread of the screw 2f is engaged also in the control circuit board 1. The rest is the same as the semiconductor device 101, and hence the description thereof is omitted.

Thus, in the semiconductor device 109, the control circuit board 1 cannot move in the direction parallel to the extending direction of the through hole 3h. Hence, in manufacturing the semiconductor device 109, when the control circuit board 1 combined with the power terminal holder 6 is combined with the semiconductor chip mounting substrate 8 in a process similar to the process illustrated in FIG. 3B, it is impossible to compensate for the height mismatch Δh between the lower surface 3d of the control signal terminal 3 and the lower surface 5d of the power terminal 5. Furthermore, in the state with the height mismatch Δh, the control signal terminal 3 and the power terminal 5 are connected and fixed to the semiconductor chip connection electrode 7 illustratively by a solder 4.

Hence, in the semiconductor device 109 of the comparative example, good connection cannot be achieved in connecting the control signal terminal 3 and the power terminal 5 to the semiconductor chip connection electrode 7. Thus, cracks and the like occur in the connecting portion due to local expansion and contraction of the connecting portion caused by heat generation and the like during operation. This results in an interference with the normal operation of the semiconductor device 109.

In contrast, as described above, in the semiconductor device 101 according to this embodiment, the control circuit board 1 and the power terminal holder 6 can be relatively moved. Hence, by compensating for the height mismatch Δh, the height of the lower surface 3d of the control signal terminal 3 can be substantially matched with the height of the lower surface 5d of the power terminal 5, and in this state, the control signal terminal 3 and the power terminal 5 can be connected and fixed to the semiconductor chip connection electrode 7. Thus, the semiconductor device 101 can provide a semiconductor device in which these terminals can be favorably connected to the semiconductor chip mounting substrate 8 even if there is a difference in height between the control signal terminal 3 and the power terminal 5. Furthermore, a semiconductor device with high reliability in which contact failure in solder connection can be prevented for a long period of time can be provided.

Furthermore, because the control signal terminal 3 and the power terminal 5 are fixed to the semiconductor chip connection electrode 7 by compensating for the height mismatch Δh between the lower surface 3d of the control signal terminal 3 and the lower surface 5d of the power terminal 5, it is possible to reduce the stress applied to these terminals, the control circuit board 1, the power terminal holder 6, and the semiconductor chip mounting substrate 8. Hence, advantageously, the semiconductor device is resistant to not only thermal stress but also mechanical stress.

In FIGS. 1 to 3, for simplicity of description, a single semi-fixing member 2 is provided. However, the number of semi-fixing members 2 is arbitrary, whether one or more than one.

In the semiconductor device 101, as described above, no thread is provided on the shank portion 2b of the semi-fixing member 2, but a thread is provided at the other end of the shank portion 2b opposite to the end portion 2a. This thread can be screwed into the power terminal holder 6 to fix the semi-fixing member 2 to the power terminal holder 6.

As an alternative structure, the diameter of the semi-fixing member hole 5h can be made sufficiently smaller than the diameter of the through hole 3h, and the other end and the shank portion 2b of the semi-fixing member 2 can have substantially the same diameter and entirely provided with a thread. Also in this case, by the thread at the other end, the semi-fixing member 2 can be fixed to the power terminal holder 6. Furthermore, because the size of the shank portion 2b is smaller than the through hole 3h, the control circuit board 1 is movable relative to the semi-fixing member 2.

However, the invention is not limited thereto. The shape of the semi-fixing member 2 is not limited to a screw, but is arbitrary as long as it has an end portion 2a larger than the through hole 3h and a shank portion 2b smaller than the through hole 3h. For instance, the semi-fixing member 2 can be a pin having the end portion 2a and the shank portion 2b as described above, without a thread at the other end opposite to the end portion 2a. As a method using such a pin, for instance, the diameter of the semi-fixing member hole 5h of the power terminal holder 6 is set to be nearly equal to the diameter of the other end of the semi-fixing member 2, and the other end of the semi-fixing member 2 can be pressed and fixed into the semi-fixing member hole 5h.

Furthermore, in the structure of the semi-fixing member 2, the end portion 2a and the shank portion 2b can be integrally formed. Alternatively, the end portion 2a and the shank portion 2b can be separately formed, and then the end portion 2a can be provided at one end of the shank portion 2b. For instance, a pin having a generally cylindrical shape can be passed through the through hole 3h and fixed to the power terminal holder 6, and an end portion 2a having a larger cross-sectional area than the through hole 3h can be provided at one end of the pin. As a specific structure, a thread can be provided at one end of the pin, and a nut serving as an end portion 2a can be fitted and rotated on the thread so that the nut is fixed to the pin. Furthermore, instead of providing a thread at one end of the pin, a solid structure serving as an end portion 2a and including a hole with nearly the same diameter as one end of the pin can be fitted and fixed thereon. The solid structure can be fixed by an adhesive and the like.

The material used for the semi-fixing member 2 is arbitrary, such as metal and resin.

Second Embodiment

A second embodiment of the invention provides a method for manufacturing a semiconductor device which includes: a semiconductor chip mounting substrate 8 including a substrate 8s, a semiconductor chip 20 provided on a first major surface 8m of the substrate 8s, and a first and second semiconductor chip connection electrodes provided on the first major surface 8m and connected to the semiconductor chip 20; a control circuit board 1 provided generally in parallel to the first major surface 8m and including a control circuit 1a for controlling the semiconductor chip 20, and a control signal terminal 3 connected to the control circuit 1a; and a power terminal holder 6 provided on the opposite side of the control circuit board 1 from the semiconductor chip mounting substrate 8 and including a power terminal 5 serving for at least one of input and output of power of the semiconductor chip 20, the first semiconductor chip connection electrode being connected to a first terminal of the semiconductor chip and the control signal terminal and the second semiconductor connection electrode being connected to a second terminal different from the first terminal of the semiconductor chip and the power terminal. In the following, features of the method for manufacturing the semiconductor device according to this embodiment are described.

Figure 5:
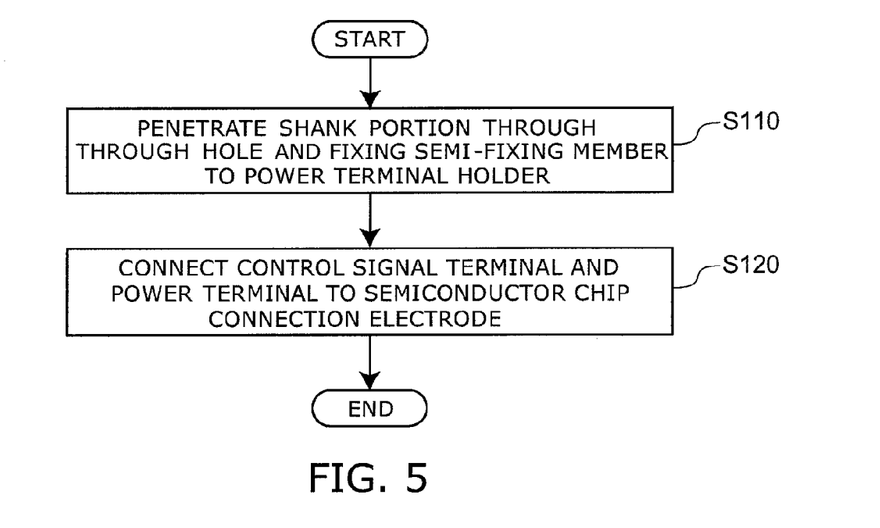
FIG. 5 is a flow chart illustrating a method for manufacturing a semiconductor device according to a second embodiment of the invention.

FIG. 5 is a flow chart illustrating a method for manufacturing the semiconductor device according to the second embodiment of the invention.

As shown in FIG. 5, in the method for manufacturing the semiconductor device according to this embodiment, the shank portion 2b of a semi-fixing member 2 is penetrated through a through hole 3h provided in the control circuit board 1 to fix the semi-fixing member 2 to the power terminal holder 6 (step S110), where the through hole 3h extends in a direction generally perpendicular to a second major surface 1m of the control circuit board 1, and the shank portion 2b has a cross section which is smaller than the cross section of the through hole 3h in the plane parallel to the second major surface 1m. In this step, the method described with reference to FIGS. 2A to 2C can be used.

Here, an end portion 2a larger than the cross section of the through hole 3h can be provided at one end of the semi-fixing member 2. This prevents the semi-fixing member 2 from slipping out of the through hole 3h by gravity and the like, and the control circuit board 1 is not disengaged from the power terminal holder 6.

Here, the end portion 2a can be previously provided at one end of the shank portion 2b of the semi-fixing member 2, and the shank portion 2b of the semi-fixing member 2 having such a structure can be penetrated through the through hole 3h to fix the semi-fixing member 2 to the power terminal holder 6.

That is, the aforementioned semi-fixing member 2 can further include, in addition to the aforementioned shank portion 2b, an end portion 2a provided at one end of the shank portion 2b and being larger than the cross section of the through hole 3h in the plane parallel to the second major surface 1m.

Alternatively, instead of previously providing the end portion 2a at one end of the shank portion 2b of the semi-fixing member 2, the end portion 2a can be provided at one end of the shank portion 2b after the shank portion 2b is penetrated through the through hole 3h to fix the semi-fixing member 2 to the power terminal holder 6.

That is, after step S110 described above, an end portion 2a larger than the cross section of the through hole 3h in the plane parallel to the second major surface 1m can be provided at one end of the shank portion 2b.

Then, the control signal terminal 3 is connected to the first semiconductor chip connection electrode and the power terminal 5 is connected to the second semiconductor chip connection electrode 7 (step S120). In this step, the method described with reference to FIGS. 3A and 3B can be used.

Thus, the control circuit board 1 and the power terminal holder 6 can be moved relatively in the direction perpendicular to the second major surface 1m. Hence, by compensating for the height mismatch Δh, the height of the lower surface 3d of the control signal terminal 3 can be matched with the height of the lower surface 5d of the power terminal 5, and in this state, the control signal terminal 3 is fixed to the first semiconductor chip connection electrode and the power terminal 5 is fixed to the second semiconductor chip connection electrode. Thus, this embodiment can provide a method for manufacturing a semiconductor device in which these terminals can be favorably connected to the semiconductor chip mounting substrate 8 even if there is a difference in height between the control signal terminal 3 and the power terminal 5.

That is, as described with reference to FIGS. 2 and 3, each connection of the control signal terminal 3 and the power terminal 5 to the first and second semiconductor chip connection electrodes can be performed in the state where, as viewed from the semiconductor chip mounting substrate 8, the height of the surface (lower surface 3d) of the control signal terminal 3 on the semiconductor chip mounting substrate 8 side is substantially matched with the height of the surface (lower surface 5d) of the power terminal 5 on the semiconductor chip mounting substrate 8 side. Thus, the semiconductor device can be manufactured with the height mismatch Δh therebetween being reduced.

Thus, before the control signal terminal 3 is connected to the first semiconductor chip connection electrode and the power terminal 5 is connected to the second semiconductor chip connection electrode, the height of the surface of the control signal terminal 3 on the semiconductor chip mounting substrate 8 side may be different from the height of the surface of the power terminal 5 on the semiconductor chip mounting substrate 8 side. After the connection, these heights are made generally equal.

In this case, for example, as described with reference to FIGS. 3A and 3B, before the connection of the control signal terminal 3 to the first semiconductor chip connection electrode and the connection of the power terminal 5 to the second semiconductor chip connection electrode, the height of the surface of the control signal terminal 3 on the semiconductor chip mounting substrate 8 side is kept lower than the height of the surface of the power terminal 5 on the semiconductor chip mounting substrate 8 side, and after the keeping, the surface of the control signal terminal 3 on the semiconductor chip mounting substrate 8 side is contacted with the first semiconductor chip connection electrode and the surface of the power terminal 5 on the semiconductor chip mounting substrate 8 side is contacted with the second semiconductor chip connection electrode while moving the control circuit board 1 toward the power terminal holder 6.

The embodiments of the invention have been described with reference to examples. However, the invention is not limited to these examples. For instance, various specific configurations of the components constituting the semiconductor device and the method for manufacturing the same are encompassed within the scope of the invention as long as those skilled in the art can similarly practice the invention and achieve similar effects by suitably selecting such configurations from conventionally known ones.

Furthermore, any two or more components of the examples can be combined with each other as long as technically feasible, and such combinations are also encompassed within the scope of the invention as long as they fall within the spirit of the invention.

Furthermore, those skilled in the art can suitably modify and implement the semiconductor device and the method for manufacturing the same described above in the embodiments of the invention, and any semiconductor device and method for manufacturing the same thus modified are also encompassed within the scope of the invention as long as they fall within the spirit of the invention.

Furthermore, those skilled in the art can conceive various modifications and variations within the spirit of the invention, and it is understood that such modifications and variations are also encompassed within the scope of the invention.

The invention claimed is:

1. A semiconductor device comprising:
a semiconductor chip mounting substrate including a substrate, a semiconductor chip provided on a first major surface of the substrate, and a first and second semiconductor chip connection electrodes;
a control circuit board provided generally in parallel to the first major surface and including a control circuit configured to control the semiconductor chip, a control signal terminal connected to the control circuit, and a through hole extending in a direction generally perpendicular to the first major surface;
a power terminal holder provided on opposite side of the control circuit board from the semiconductor chip mounting substrate and including a power terminal serving for at least one of input and output of power of the semiconductor chip; and
a semi-fixing member including a shank portion and an end portion, the shank portion being fixed to the power terminal holder and penetrating through the through hole, a cross section of the shank portion in a plane orthogonal to the extending direction of the through hole being smaller than a size of the through hole, the end portion being connected to a tip of the shank portion, a cross section of the end portion in a plane orthogonal to the extending direction of the through hole being larger than the size of the through hole,
the first semiconductor chip connection electrode being connected to a first terminal of the semiconductor chip and the control signal terminal, and
the second semiconductor chip connection electrode being connected to a second terminal different from the first terminal of the semiconductor chip and the power terminal,
wherein the tip is an end of the shank portion on the semiconductor chip mounting substrate side.

2. The device according to claim 1, wherein a gap is provided between the semi-fixing member and the control circuit board.

3. The device according to claim 1, wherein a distance obtained by subtracting a thickness of the control circuit board from distance between a surface of the end portion on the power terminal holder side and a surface of the power terminal holder on the control circuit board side is larger than a distance between a plane including a surface of the control signal terminal opposed to the first semiconductor chip connection electrode and a plane including a surface of the power terminal opposed to the second semiconductor chip connection electrode.

4. The device according to claim 1, wherein a relative moving distance between the control circuit board and the power terminal holder in a direction orthogonal to the extending direction of the through hole is smaller than a relative moving distance between the control circuit board and the power terminal holder in a direction parallel to the extending direction of the through hole.

5. The device according to claim 1, wherein the power terminal holder further includes a control electrode hole allowing a control electrode provided on the control circuit board to be penetrated through.

6. The device according to claim 5, wherein a gap is provided between the control electrode hole and the control electrode so that the power terminal holder and the control electrode can be relatively moved.

7. The device according to claim 1, wherein the control circuit board further includes a power terminal hole allowing the power terminal to be penetrated through.

8. The device according to claim 7, wherein a gap is provided between the power terminal hole and the power terminal so that the control circuit board and the power terminal can be relatively moved.

9. The device according to claim 1, wherein the semiconductor chip includes at least one semiconductor element of an Insulated Gate Bipolar Transistor and a power Metal Oxide Semiconductor Field Effect Transistor.

10. The device according to claim 1, wherein the semiconductor chip and the first and second semiconductor chip connection electrodes are connected to each other by at least one of a bonding wire and a solder.

11. The device according to claim 1, wherein the semiconductor chip mounting substrate includes a ceramic substrate.

12. A semiconductor device comprising:
a semiconductor chip mounting substrate including a substrate, a semiconductor chip provided on a first major surface of the substrate, and a first and second semiconductor chip connection electrodes;
a control circuit board provided generally in parallel to the first major surface and including a control circuit configured to control the semiconductor chip, a control signal terminal connected to the control circuit, and a through hole extending in a direction generally perpendicular to the first major surface;
a power terminal holder provided on opposite side of the control circuit board from the semiconductor chip mounting substrate and including a power terminal serving for at least one of input and output of power of the semiconductor chip; and
a semi-fixing member including a shank portion and an end portion, the shank portion being fixed to the power terminal holder and penetrating through the through hole, a cross section of the shank portion in a plane orthogonal to the extending direction of the through hole being smaller than a size of the through hole, the end portion being connected to a tip of the shank portion, a cross section of the end portion in a plane orthogonal to the extending direction of the through hole being larger than the size of the through hole,
the first semiconductor chip connection electrode being connected to a first terminal of the semiconductor chip and the control signal terminal, and
the second semiconductor chip connection electrode being connected to a second terminal different from the first terminal of the semiconductor chip and the power terminal,
wherein the end portion is provided nearer to the semiconductor chip mounting substrate than a surface of the control circuit board on the semiconductor chip mounting substrate side.

13. A semiconductor device comprising:
a semiconductor chip mounting substrate including a substrate, a semiconductor chip provided on a first major surface of the substrate, and a first and second semiconductor chip connection electrodes;
a control circuit board provided generally in parallel to the first major surface and including a control circuit configured to control the semiconductor chip, a control signal terminal connected to the control circuit, and a through hole extending in a direction generally perpendicular to the first major surface;

a power terminal holder provided on opposite side of the control circuit board from the semiconductor chip mounting substrate and including a power terminal serving for at least one of input and output of power of the semiconductor chip; and a semi-fixing member including a shank portion and an end portion, the shank portion being fixed to the power terminal holder and penetrating through the through hole, a cross section of the shank portion in a plane orthogonal to the extending direction of the through hole being smaller than a size of the through hole, the end portion being connected to a tip of the shank portion, a cross section of the end portion in a plane orthogonal to the extending direction of the through hole being larger than the size of the through hole, the first semiconductor chip connection electrode being connected to a first terminal of the semiconductor chip and the control signal terminal, and the second semiconductor chip connection electrode being connected to a second terminal different from the first terminal of the semiconductor chip and the power terminal, wherein relative position of the semi-fixing member and the control circuit board is movable in a direction parallel to the extending direction of the through hole.

* * * * *